United States Patent [19]

Hosoda et al.

[11] Patent Number: 4,860,315

[45] Date of Patent: Aug. 22, 1989

[54] ADPCM ENCODING AND DECODING CIRCUITS

[75] Inventors: Kenichiro Hosoda; Shinji Kawaguchi; Atsushi Shinbo; Kiyoshi Yokota, all of Tokyo, Japan

[73] Assignee: Oki Electric Industry Co., Ltd., Tokyo, Japan

[21] Appl. No.: 184,082

[22] Filed: Apr. 20, 1988

[30] Foreign Application Priority Data

Apr. 21, 1987 [JP] Japan ................................ 62-096298

[51] Int. Cl.$^4$ .............................................. H03M 3/04
[52] U.S. Cl. ........................................ 375/30; 341/51; 375/33
[58] Field of Search .................... 358/13, 133; 375/27, 375/30, 31, 33; 332/11 R, 11 D; 381/29, 31; 341/51, 76

[56] References Cited

U.S. PATENT DOCUMENTS

| | | | |
|---|---|---|---|
| 4,075,655 | 2/1978 | Iijima et al. | 375/33 |
| 4,617,676 | 10/1986 | Jayant et al. | 375/27 |
| 4,654,863 | 3/1987 | Belfield et al. | 375/27 |
| 4,743,967 | 5/1988 | Takenaka et al. | 375/27 |

OTHER PUBLICATIONS

"32 kbit/s Adaptive Differential Pulse Code Modulation (ADPCM)" (Malaga–Torremolinos, 1984) Fascicle III.3–Rec. G721, pp. 125–158.

*Primary Examiner*—Benedict V. Safourek
*Attorney, Agent, or Firm*—Spencer & Frank

[57] ABSTRACT

In an ADPCM encoding and decoding system comprising an encoder having an adaptive predictor and an adaptive quantizer and a decoder having an adaptive predictor and an inverse adaptive quantizer, the adaptive predictors each comprise: an adaptive-zero predictor of an arbitrary order and an adaptive-pole predictor of an arbitrary order, for input signals with time-varying frequency components; a fixed-pole predictor of an arbitrary order, for input signals the frequency composition of which remains substantially invariant over time; and an offset predictor for rejecting an offset component of the input signals, these elements being connected in series. The adaptive-zero and adaptive-pole predictors generate estimates for voice signals with time-varying frequency components. The fixed-pole predictor generates estimates for voiceband data signals the frequency components of which remain substantially invariant over time. The adaptive predictors effectively operate for voice and voiceband data signals, providing a higher prediction gain. The quantizer provides a stably higher signal-to-quantization noise ratio for modem signals.

24 Claims, 6 Drawing Sheets

ADPCM ENCODING AND DECODING CIRCUITS

BACKGROUND OF THE INVENTION

This invention relates to an ADPCM encoding and decoding system for providing successive, adaptive, predictive estimates of a voice signal or a voiceband data signal and encoding the signal at a low bit rate.

32-kbit/s ADPCM encoding and decoding circuits are used for transmitting information in a compressed form, principally in fields such as voice communications and analog modem communications. The CCITT (Consultative Committee on International Telephone and Telegraph) has issued a recommendation (G.721) concerning this type of ADPCM encoding and decoding circuits. To facilitate the understanding of this invention, the explanation of the invention will be preceded by an explanation of the CCITT's recommended 32-kbit/s ADPCM encoding and decoding circuits, with reference to FIG. 4A and FIG. 4B.

Figure 4A:
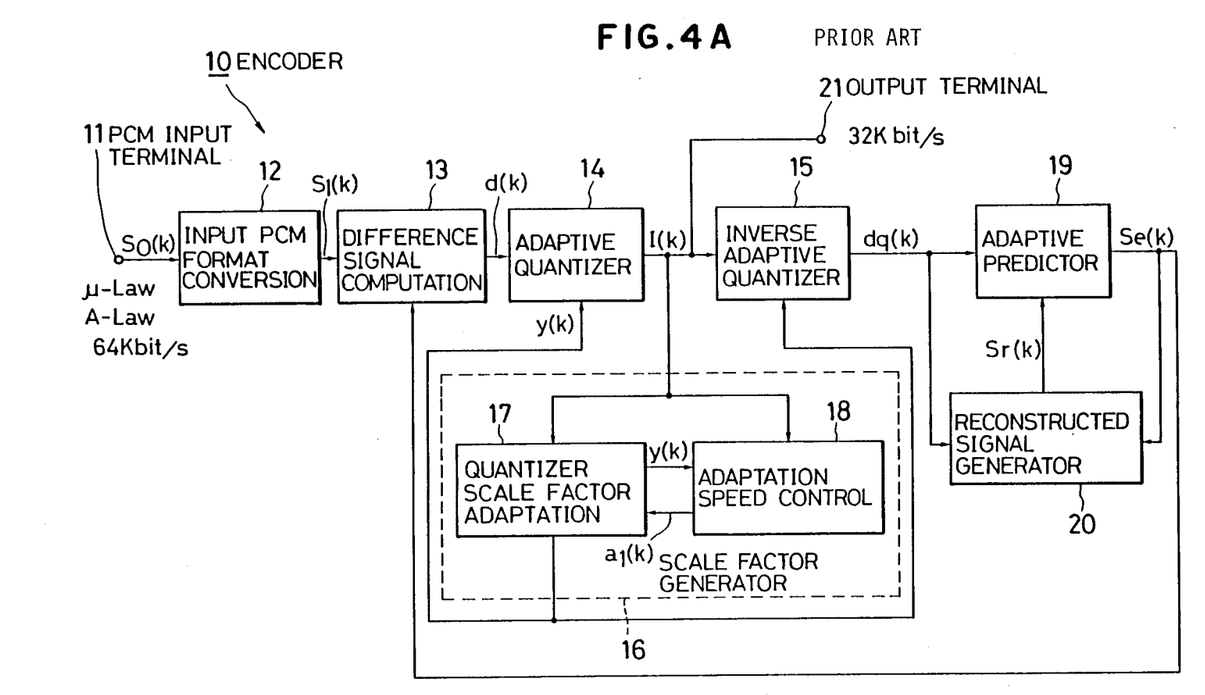
FIG. 4A is a block diagram illustrating the configuration of a prior art ADPCM encoder.
Figure 4B:
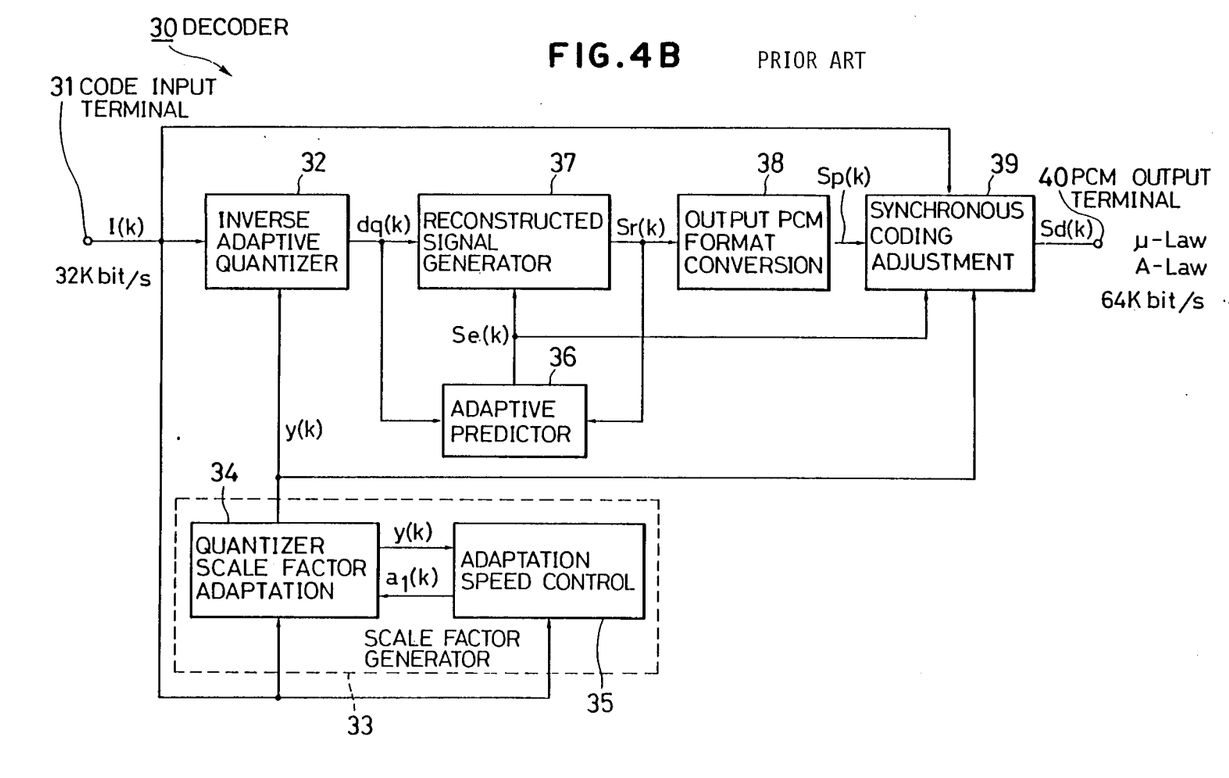
FIG. 4B is a block diagram illustrating the configuration of a prior art ADPCM decoder.

FIG. 4A shows the configuration of the prior art ADPCM encoder 10; FIG. 4B shows the configuration of the prior art ADPCM decoder 30. The ADPCM encoder 10 is an encoder that converts a 64-kbit/s$\mu$-law code or A-law code to a 32-kbit/s code. In this encoder 10, the numeral 11 denotes a PCM input terminal, 12 is an input PCM conversion, 13 is a difference signal computation comprising a subtractor, 14 is an adaptive quantizer, 15 is an inverse adaptive quantizer, 16 is a scale factor generator comprising a quantizer scale factor adaptation 17 and an adaptation speed control 18, 19 is an adaptive predictor, 20 is a reconstructed signal generator comprising an adder, and 21 is the output terminal of the encoder 10.

The decoder 30 is a device for converting a 32-kbit/s code to a 64-kbit/s output signal. The numeral 31 denotes a code input terminal, 32 is an inverse adaptive quantizer, 33 is a scale factor generator comprising a quantizer scale factor adaptation 34 and an adaptation speed control 35, 36 is an adaptive predictor, 37 is a reconstructed signal generator comprising an adder, 38 is an output PCM format conversion, 39 is a synchronous coding adjustment, and 40 is a PCM output terminal.

The operation of this prior art ADPCM encoder and decoder will be explained as follows.

First the operation of the encoder 10 will be explained. A $\mu$-law or A-law PCM code $S_o(k)$ received at the input terminal 11 is converted by the input PCM format conversion 12 to a linear PCM signal $S_1(k)$ which is supplied to the difference signal computation 13. The output of the difference signal computation 13 is a difference signal $d(k)$ obtained by subtraction of a signal estimate $S_e(k)$ given by the adaptive predictor 19 as described later from this signal $S_1(k)$. The difference signal $d(k)$ is scaled in the next-stage adaptive quantizer 14 by a scale factor $y(k)$ sent from the quantizer scale factor adaptation 17 in the scale factor generator 16, then encoded as a 4-bit code $I(k)$, which is sent at a 32-kbit/s bit rate from the output terminal 21 to the decoder 30, and is also supplied to the inverse adaptive quantizer 15 in the next stage. The inverse adaptive quantizer 15 reconstructs the inversely-quantized value $dq(k)$ of the code $I(k)$ and sends it to the adaptive predictor 19 and the reconstructed signal generator 20. The adaptive predictor 19 receives from the reconstructed signal generator 20 the reconstructed value $Sr(k)$ of the input $S_1(k)$, and uses it to generate a signal estimate $Se(k)$.

As already noted, the scale factor generator 16 comprises a quantizer scale factor adaptation 17 and an adaptation speed control 18. The adaptation speed control 18 sends a linear combination coefficient $a_1(k)$ having a value corresponding to the average amplitude of the code $I(k)$ to the quantizer scale factor adaptation 17, which generates the scale factor $y(k)$ given by this coefficient $a_1(k)$.

First the short-term average value $d_{ms}(k)$ and the long-term average value $d_{ml}(k)$ of the amplitude of the code $I(k)$ are calculated in the adaptation speed control 18 having differing time constants.

$$d_{ms}(k)=(1-2^{-5})d_{ms}(k-1)+2^{-5}F\{I(k)\} \quad (1)$$

$$d_{ml}(k)=(1-2^{-7})d_{ml}(k-1)+2^{-7}F\{I(k)\} \quad (2)$$

where $F\{I(k)\}$ is a value from a constant table that is predetermined according to $I(k)$ and is read according to $I(k)$ from a memory (not shown in the drawing) disposed in the adaptation speed control 18. A comparison of the values of $d_{ms}(k)$ and $d_{ml}(k)$ calculated in this way indicates whether the difference signal $d(k)$ is a time-varying signal, as in the case of a voice signal, or a signal of which the average amplitude is substantially invariant over time, as in the case of a voiceband data signal. The value of the linear combination coefficient (parameter) $a_1(k)$ sent from the adaptation speed control 18 to the quantizer scale factor adaptation 17 is successively updated so as to approach a value of "1" if the difference signal $d(k)$ is a time-varying signal, or a value of "0" if its average amplitude is substantially invariant over time.

The scale factor generated by the quantizer scale factor adaptation 17 is given by the following formulas:

$$y_u(k) = (1 - 2^{-5})y(k) + 2^{-5}W\{I(k)\} \quad (3)$$

$$y_l(k) = (1 - 2^{-6}) y_l(k - 1) + 2^{-6}y_u(k) \quad (4)$$

$$y(k) = a_1(k)y_u(k - 1) + \{1 - a_1(k)\}y_l(k - 1) \quad (5)$$

where $y_u(k)$ is a scale factor for a voice signal, $y_l(k)$ is a scale factor for a voiceband data signal, $W\{I(k)\}$ is a constant, called an M-table value, predetermined according to $I(k)$, and $a_1(k)$ is the aforesaid linear combination parameter received from the adaptation speed control 18.

The difference between $d_{ms}(k)$ and $d_{ml}(k)$ varies with time depending on, for example, whether the signal is a voice signal or a voiceband data signal. The parameter $a_1(k)$ is successively updated toward "1" or "0" according to the size of this difference. As a result the scale factor $y(k)$ is determined by the form of the linear combination of $y_u(k)$ and $y_l(k)$. The scale factor $y(k)$ is sent to the adaptive quantizer 14 and the inverse adaptive quantizer 15 to prevent the degradation of quantization characteristics with respect to a variety of signals.

The signal reconstructed by the inverse adaptive quantizer 15 is a quantizer difference signal $d_q(k)$ which includes a quantizing error. This signal $d_q(k)$ is sent to the reconstructed signal generator 20 where it is added to the signal estimate received from the adaptive predictor 19 to generate the reconstructed signal $Sr(k)$ of the linear PCM signal $S_1(k)$, and this is sent to the adaptive predictor 19. The adaptive predictor 19 comprises a transversal filter, having the tap coefficients which are modified to reduce the power of d(k), namely d²(k), and which coefficients are convoluted with the reconstructed signal at a past sampling instant to generate a signal estimate Se(k) of the input signal at the next sampling instant.

The operation of the decoder 30 is described next. The inverse adaptive quantizer 32 in the decoder 30 uses the scale factor y(k) received from the scale factor generator 33 and generates the reconstructed difference signal $d_q(k)$. The reconstructed difference signal $d_q(k)$ is sent to the adaptive predictor 36 and the reconstructed signal generator 37 and is added in the reconstructed signal generator 37 to the signal estimate Se(k) received from the adaptive predictor 36 to form the reconstructed signal $S_r(k)$, which is the reconstructed value of the input signal $S_1(k)$. The adaptive predictor 36 produces this signal estimate Se(k) from the reconstructed difference signal $d_q(k)$ and the reconstructed signal Sr(k). As long as there are no bit errors between the code output terminal 21 and the code input terminal 31, the scale factor generator 33 (34, 35) and the adaptive predictor 36 of the decoder 30 perform exactly the same operations as the corresponding elements 16 (17, 18) and 19 in the encoder 10, and their internal states also agree. The reconstructed signal Sr(k) of the input signal $S_1(k)$ is converted by the output PCM format conversion 38 to aµ-law or A-law PCM code Sp(K). The code Sp(k) is adjusted using the code I(k), the signal estimate Se(k), and the scale factor y(k) so that even if PCM and ADPCM links are interconnected synchronously, as in a PCM-ADPCM-PCM-ADPCM interconnection, no more degradation occurs than would occur in the first-stage PCM-ADPCM-PCM interconnection; then the code Sp(k) is converted to aµ-law or A-law PCM code Sd(k) and is transmitted at a rate of 64-kbit/s from the PCM output terminal 40.

CCITT Study Group XVIII has already reported in its Report R-28 that the 32-kbit/s ADPCM encoding and decoding algorithm described in CCITT recommendation G.721 shows good performances for voice signals and low-speed voiceband data signals (modem signals below 4800 bit/s).

But there are also problems with the characteristics: the adaptive predictor in the prior art ADPCM encoding and decoding circuits has poor predictive capabilities for high-speed modem signals of 7200 bit/s and above, as are widely used in GIII facsimile for example; and even when the power of the input signal is constant, as in a modem signal, the scale factor does not remain fixed but fluctuates, causing degradation of the quantizing characteristics of modem signals. Futhermore, the prior art ADPCM encoding and decoding circuits do not provide functions suited for use in PCM digital speech interpolation (DSI) in the field of international communications via satellite. A particular problem is its inability to transmit three-bit codes, hence its inability to support the method, used in DSI, of preventing a freezeout of tranks when the communication channel is overloaded, by reducing by one the number of bits assigned per channel.

SUMMARY OF THE INVENTION

An object of this invention is to provide an ADPCM encoding and decoding system that solves these problems in the prior art, possesses performance exceeding that of the ADPPCM encoding and decoding circuits according to CCITT G.721, is capable of transmitting high-speed voiceband data signals (modem signals of 7200 bit/s or higher), supports the method used in DSI of preventing the freezeout of input tranks when the channel is overloaded by reducing the number of assigned bits by one, and can transmit modem signals at rates of 9600 bit/s and higher even over three or more asynchronously interconnected links.

An ADPCM encoding and decoding circuits of the invention comprises an encoder having an adaptive predictive filter and an adaptive quantizer, and a decoder having an adaptive predictive filter and an inverse adaptive quantizer. To solve the problems of the prior art stated above, the adaptive predictive filters in the encoder and decoder each comprise an adaptive-zero filter of an arbitrary order and a adaptive-pole filter of an arbitrary order for input signals with time-varying frequency components, a fixed-pole filter of an arbitrary order for input signals the frequency components of which are substantially invariant over time, and an offset estimation filter for the offset component, these elements being connected in series.

In the structure described above, the adaptive-zero filter and adaptive-pole filter in the adaptive predictive filter generate estimates of input signals with time-varying frequency components. The fixed-pole filter generates estimates of input signals the frequency components of which remain substantially invariant over time. The offset estimation filter functions to reject the offset component of the input signal. The estimate produced by the adaptive predictive filter therefore has extremely high predictive gain and the quantizing characteristics of modem signals are not degraded. In addition, this invention is well equipped to cope with DSI by varying the bit rate.

DETAILED DESCRIPTION OF THE EMBODIMENTS

A preferred embodiment of this invention will be described with reference to FIGS. 1A and 1B.

Figure 1A:
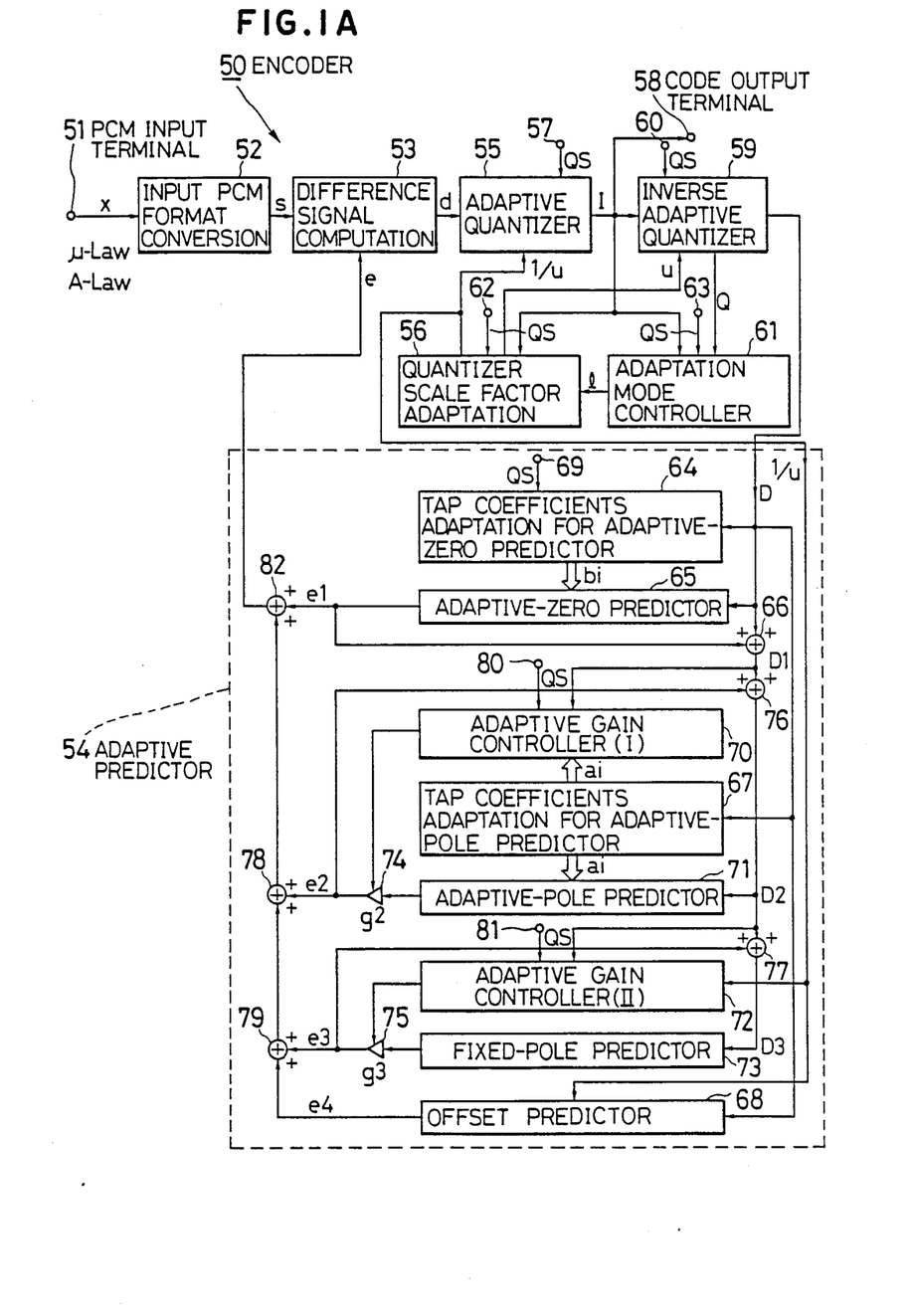
FIG. 1A is a block diagram showing the configuration of an encoder according to the present invention.

FIG. 1A is a block diagram showing the configuration of a variable-bit-rate ADPCM encoder 50 according to this embodiment. FIG. 1B, consisting of FIGS. 1B(a) and 1B(b) is a block diagram showing the configuration of a variable-bit-rate ADPCM decoder 100 according to this embodiment.

In the encoder 50 in FIG. 1A, reference numeral 51 denotes a PCM input terminal, 52 is an input PCM format conversion, 53 is a difference signal computation, 54 is an adaptive predictor, 55 is an adaptive quantizer, 56 is a quantizer scale factor adaptation, 57, 60, 62, and 63 are external input terminals, 58 is a code output terminal, 59 is an inverse adaptive quantizer, and 61 is an adaptation mode controller. The adaptive predictor 54 comprises a tap coefficients adaptation for adaptive-zero predictor, an adaptive-zero predictor 65, adders 66, 76, 77, 78, 79, and 82, a tap coefficient adaptation for an adaptation-pole predictor 67, an offset predictor 68, external signal input terminals 69, 80, and 81, an adaptive gain controller (I) 70, an adaptive-pole predictor 71, an adaptive gain controller (II) 72, a fixed-pole predictor 73, and coefficient circuits 74 and 75.

Figure 1B:
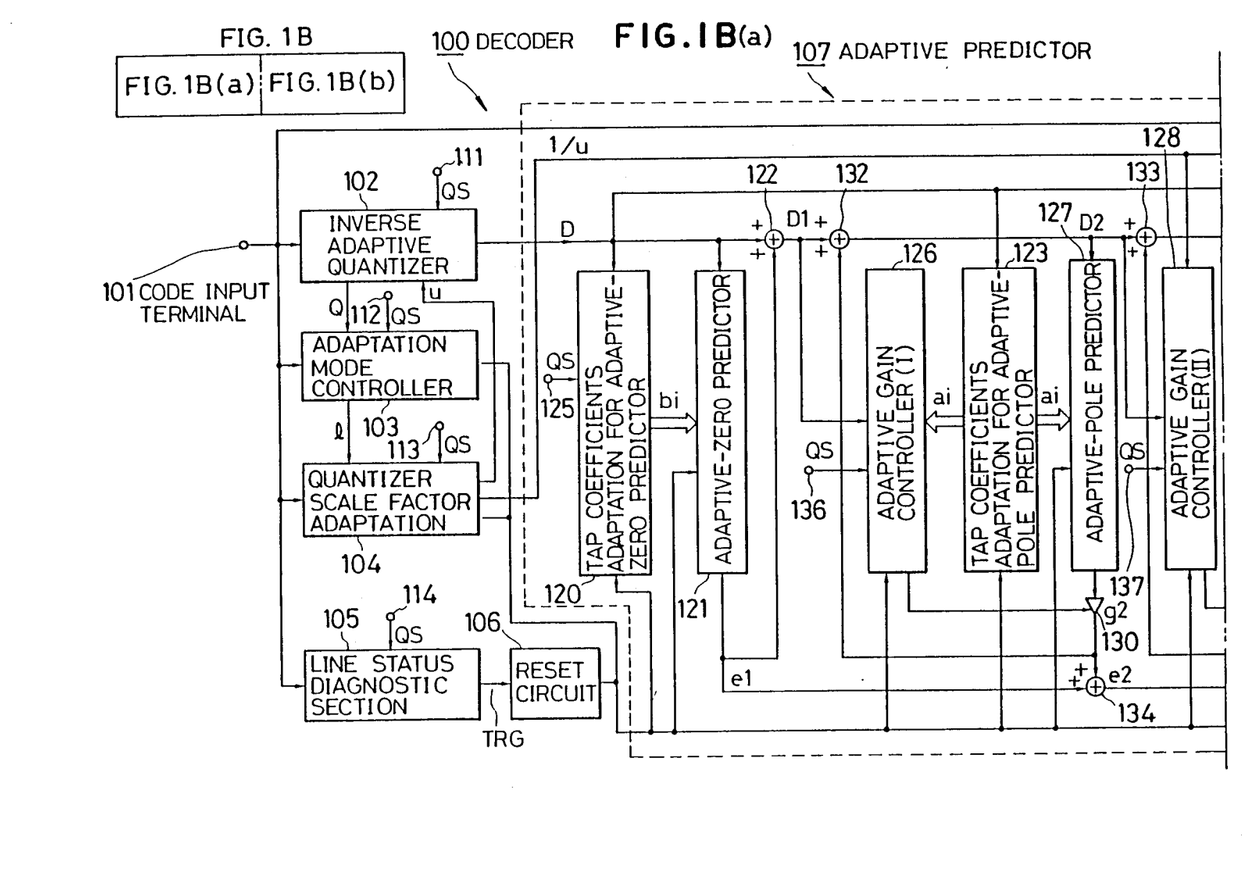
FIGS. 1B, 1B(a) and 1B(b) comprise a block diagram showing the configuration of a decoder according to the present invention.

In the decoder in FIG. 1B, reference numeral 101 denotes a code input terminal, 102 is an inverse adaptive quantizer, 103 is an adaptation mode controller, 104 is a quantizer scale factor adaptation, 105 is a line status diagnostic section, 106 is a reset circuit, 107 is an adaptive predictor, 108 is an output PCM format conversion, 109 is a synchronous coding adjustment, 110 is a PCM output terminal, and 111 to 115 are external input terminals. The adaptive predictor 107 comprises a tap coefficients adaptation 120 for adaptive-zero predictor, an adaptive-zero predictor 121, adders 122, 132, 133, 134, 135, 138, and 139, a tap coefficients adaptation 123 for adaptive-pole predictor, an offset predictor 124, external input terminals 125, 136, and 137, an adaptive gain controller (I) 126, an adaptive-pole predictor 127, an adaptive gain controller (II) 128, a fixed-pole predictor 129, and coefficient circuits 130 and 131.

Next the operation of this embodiment will be explained.

First the operation of the encoder 50 will be explained. A $\mu$-law or A-law PCM code x(k) input to the PCM input terminal 51 is converted by the input PCM format conversion 52 to a linear PCM signal S(k), which is supplied to the difference signal computation 53. The difference signal computation 53 subtracts a value Se(k) estimated by the adaptive predictor 54 from the linear PCM signal S(k) as shown in formula (6) to generate the difference signal d(k).

$$d(k) = S(k) - Se(k) \quad (6)$$

The difference signal d(k) is scaled to a value q(k) in the adaptive quantizer 55 by the scale factor u(k) received from the quantizer scale factor adaptation 56, as shown in formula (7), then encoded to the output code I(k).

$$q(k) = d(k)/u(k) \quad (7)$$

Depending on the bit rate switching signal QS input at the external input terminal 57, q(k) is encoded to four bits as in Table 1 when QS=1, three bits as in Table 2 when QS=2, or five bits as in Table 3 when QS=3. In Tables 1 to 3, the symbol "[" indicates inclusion and the symbol "(" indicates exclusion of the value. The values 1, 2, and 3 of QS correspond to bit rates of 32, 24, and 40 kbit/s, respectively.

TABLE 1

| QUANTIZER INPUT RANGE q (k) | I (k) |
|---|---|
| [2.344, +∞) | 7 |
| [1.776, 2.344) | 6 |
| [1.361, 1.776) | 5 |
| [1.013, 1.361) | 4 |
| [0.7030, 1.013) | 3 |
| [0.4143, 0.7030) | 2 |
| [0.1369, 0.4143) | 1 |
| (−0.1369, 0.1369) | 8 |
| (−0.4143, −0.1369] | 9 |
| (−0.7030, −0.4143] | 10 |
| (−1.013, −0.7030] | 11 |
| (−1.361, −1.013] | 12 |
| (−1.776, −1.361] | 13 |
| (−2.334, −1.776] | 14 |
| (−∞, −2.344] | 15 |

TABLE 2

| QUANTIZER INPUT RANGE q (k) | I (k) |
|---|---|
| [2.359, +∞) | 3 |
| [1.121, 2.359) | 2 |
| [0.3281, 1.121) | 1 |
| (−0.3281, 0.3281) | 4 |
| (−1.121, −0.3281] | 5 |
| (−2.359, −1.121] | 6 |
| (−∞, −2.359] | 7 |

TABLE 3

| QUANTIZER INPUT RANGE q (k) | I (k) | QUANTIZER INPUT RANGE q (k) | I (k) |
|---|---|---|---|
| [2.953, ∞) | 15 | (−∞, −2.9533] | 31 |
| [2.477, 2.953) | 14 | (−2.953, −2.477] | 30 |
| [2.145, 2.477) | 13 | (−2.477, −2.145] | 29 |
| [1.875, 2.145) | 12 | (−2.145, −1.875] | 28 |
| [1.645, 1.875) | 11 | (−1.875, −1.645] | 27 |
| [1.445, 1.645) | 10 | (−1.645, −1.445] | 26 |
| [1.258, 1.445) | 9 | (−1.445, −1.258] | 25 |
| [1.090, 1.258) | 8 | (−1.258, −1.090] | 24 |
| [0.9258, 1.090) | 7 | (−1.090, −0.9258] | 23 |
| [0.7734, 0.9258) | 6 | (−0.9258, −0.7734] | 22 |
| [0.6250, 0.7734) | 5 | (−0.7734, −0.6250] | 21 |
| [0.4805, 0.6250) | 4 | (−0.6250, −0.4805] | 20 |
| [0.3438, 0.4805) | 3 | (−0.4805, −0.3438] | 19 |
| [0.2031, 0.3438) | 2 | (−0.3438, −0.2031] | 18 |
| [0.0664, 0.2031) | 1 | (−0.2031, −0.0664] | 17 |
| (−0.0664, 0.0664) | 16 | | |

The code I(k) is sent from the code output terminal 58 to the decoder 100 (FIG. 1B), and is also supplied to the inverse adaptive quantizer 59 in the next stage, the quantizer scale factor adaptation 56, and the adaptation mode controller 61.

The inverse adaptive quantizer 59 reconstructs the inversely quantized value D(k) of the difference signal d(k) according to formula (8), using the signal Q(k) determined by I(k) and the scale factor u(k) received from the quantizer scale factor adaptation 56.

$$D(k) = Q(k)u(k) \quad (8)$$

Q(k) is sent to the adaptation mode controller 61 according to Table 4 if the bit-rate switching signal QS input at the external input terminal 60 is QS=1, according to Table 5 if QS=2, and according to Table 6 if QS=3.

TABLE 4

| I (k) | Q (k) | I (k) | Q (k) |
|---|---|---|---|
| 7 | 2.681 | 9 | −0.2739 |
| 6 | 2.007 | 10 | −0.5548 |
| 5 | 1.546 | 11 | −0.8512 |
| 4 | 1.175 | 12 | −1.175 |
| 3 | 0.8512 | 13 | −1.546 |
| 2 | 0.5548 | 14 | −2.007 |
| 1 | 0.2739 | 15 | −2.681 |
| 0 | 0 | | |
| 8 | 0 | | |

TABLE 5

| I (k) | Q (k) |
|---|---|
| 3 | 3.138 |
| 2 | 1.583 |
| 1 | 0.6597 |
| 0 | 0 |
| 4 | 0 |
| 5 | −0.6597 |
| 6 | −1.583 |
| 7 | −3.138 |

TABLE 6

| I (k) | Q (k) | I (k) | Q (k) |
|---|---|---|---|
| 15 | 3.239 | 31 | −3.239 |
| 14 | 2.665 | 30 | −2.665 |
| 13 | 2.289 | 29 | −2.289 |
| 12 | 1.997 | 28 | −1.997 |
| 11 | 1.753 | 27 | −1.753 |
| 10 | 1.540 | 26 | −1.540 |
| 9 | 1.347 | 25 | −1.347 |
| 8 | 1.170 | 24 | −1.170 |
| 7 | 1.005 | 23 | −1.005 |
| 6 | 0.8481 | 22 | −0.8481 |
| 5 | 0.6978 | 21 | −0.6978 |
| 4 | 0.5527 | 20 | −0.5527 |
| 3 | 0.4116 | 19 | −0.4116 |
| 2 | 0.2729 | 18 | −0.2729 |
| 1 | 0.1362 | 17 | −0.1362 |
| 0 | 0 | 16 | 0 |

TABLE 7

| I (k) | F1 {I (k)} | F2 {I (k)} | I (k) | F1 {I (k)} | F2 {I (k)} |
|---|---|---|---|---|---|
| 7 | 1.2695 | 1.0825 | 8 | −0.2495 | 0.1235 |
| 6 | 0.4883 | 0 | 9 | −0.1709 | 0.0503 |
| 5 | 0.1294 | 0 | 10 | −0.1123 | 0 |
| 4 | −0.0708 | 0 | 11 | −0.0977 | 0 |
| 3 | −0.0977 | 0 | 12 | −0.0708 | 0 |
| 2 | −0.1123 | 0 | 13 | 0.1294 | 0 |
| 1 | −0.1709 | 0.0503 | 14 | 0.4883 | 0 |
| 0 | −0.2495 | 0.1235 | 15 | 1.2695 | 1.0825 |

TABLE 8

| I (k) | F1 {I (k)} | F2 {(k)} |
|---|---|---|
| 3 | 0.4883 | 0 |
| 2 | 0.0317 | 0 |
| 1 | −0.2832 | 0 |
| 0 | −0.3320 | 0 |
| 4 | −0.3320 | 0 |
| 5 | −0.2832 | 0 |
| 6 | 0.0317 | 0 |
| 7 | 0.4883 | 0 |

TABLE 9

| I (k) | F1 {I (k)} | F2 {I (k)} | I (k) | F1 {I (k)} | F2 {I (k)} |
|---|---|---|---|---|---|
| 15 | 1.2695 | 1.0825 | 31 | 1.2695 | 1.0825 |
| 14 | 1.2695 | 1.0825 | 30 | 1.2695 | 1.0825 |
| 13 | 0.4883 | 0 | 29 | 0.4883 | 0 |
| 12 | 0.4883 | 0 | 28 | 0.4883 | 0 |
| 11 | 0.1294 | 0 | 27 | 0.1294 | 0 |
| 10 | 0.1294 | 0 | 26 | 0.1294 | 0 |
| 9 | −0.0708 | 0 | 25 | −0.0708 | 0 |
| 8 | −0.0708 | 0 | 24 | −0.0708 | 0 |
| 7 | −0.0977 | 0 | 23 | −0.0977 | 0 |
| 6 | −0.0977 | 0 | 22 | −0.0977 | 0 |
| 5 | −0.1123 | 0 | 21 | −0.1123 | 0 |
| 4 | −0.1123 | 0 | 20 | −0.1123 | 0 |
| 3 | −0.1709 | 0.0503 | 19 | −0.1709 | 0.0503 |
| 2 | −0.1709 | 0.0503 | 18 | −0.1709 | 0.0503 |
| 1 | −0.2495 | 0.1235 | 17 | −0.2495 | 0.1235 |
| 0 | −0.2495 | 0.1235 | 16 | −0.2495 | 0.1235 |

The quantizer scale factor adaptation 56 successively updates the scale factor v(k) defined corresponding to u(k) in the base-2 logarithmic domain according to the following formulas:

$$v1(k) = (1 - 2^{-6})v(k) + [F1\{I(k)\} + I(k)F2\{I(k)\}] \quad (8)$$

$$v2(k) = (1 - 2^{-3})v2(k - 1) + 2^{-3} v1(k) \quad (10)$$

$$v(k) = \{1 - l(k - 1)\}v1(k - 1) + l(k - 1)v2(k - 1) \quad (11)$$

where v(k) is limited by $-11.2876 \leq v(k) \leq -1.3218$ when $QS = 1$ or 3, and by $-11.7959 \leq v(k) \leq -1.3218$ when $QS = 2$.

In the formulas above v1(k) is a scale factor that responds to short-term fluctuations of the input, and v2(k) is a scale factor that responds to long-term fluctuations of the input. v(k) is obtained as a linear combination of v1(k) and v2(k) according to the mode control coefficient l received from the adaptation mode controller 61.

F1{I(k)} and F2{I(k)} are constants predetermined according to the code I(k) and depending on the bit-rate switching signal QS input at the external input terminal 62, taken from Table 7 when QS=1, Table 8 when QS=2, and Table 9 when QS=3.

The quantizer scale factor adaptation 56 converts the scale factor v(k) in the base-2 logarithmic domain to the scale factors u(k) and 1/u(k) in the linear domain according to the following formulas:

For u(k)

$$j1(k) = INT\{v(k)\} \quad (12)$$

$$f1(k) = v(k) - j1(k) \quad (13)$$

$$f2(k) = 1 + 2f1(k)/3 + f1^2(k)/6 \quad (14)$$

$$u(k) = f2(k)2^{j1(k)} \quad (15)$$

For 1/u(k)

$$j2(k) = INT\{-v(k)\} + 1 \quad (16)$$

$$f3(k) = [-v(k) - INT\{-v(k)\}] - 1 \quad (17)$$

$$f4(k) = 1 + 2\beta(k)/3 + \beta^2(k)/6 \tag{18}$$

$$1/u(k) = f4(k)2^{/2(K)} \tag{19}$$

where INT{•} indicates the integer part of the variable enclosed in the braces. 1/u(k) is sent to the adaptive quantizer 55 and the offset predictor 68.

The adaptation mode controller 61 sends the quantizer scale factor adaptation 56 a mode control coefficient l(k) that depends on the power and frequency composition of the difference signal d(k). This mode control coefficient l(k), which is a coefficient that selects either a short-term mode or a long-term mode depending on the properties of the input signal, is determined as follows.

First a value m(k) corresponding to the power of the difference signal d(k) is calculated from formula (20).

$$m(k) = (1-2^{-7})m(k-1) + 2^{-7}F3\{I(k)\} \tag{20}$$

where F3{I(k)} is a value in a constant table predetermined according to I(k) and depending on the bit-rate switching signal QS input at the external input terminal 63, being taken from Table 10 when QS=1, from Table 11 when QS=2, and from Table 12 when QS=3.

TABLE 10

| I(k) | 7 | 6 | 5 | 4 | 3 | 2 | 1 | 0 | 8 | 9 | 10 | 11 | 12 | 13 | 14 | 15 |
|---|---|---|---|---|---|---|---|---|---|---|---|---|---|---|---|---|
| F3 | 7 | 3 | 1 | 1 | 1 | 0 | 0 | 0 | 0 | 0 | 0 | 0 | 1 | 1 | 1 | 3 | 7 |

TABLE 11

| I (k) | 3 | 2 | 1 | 0 | 4 | 5 | 6 | 7 |
|---|---|---|---|---|---|---|---|---|
| F3 {I (k)} | 3.563 | 0 | 0 | 0 | 0 | 0 | 0 | 3.563 |

TABLE 12

| I (k) | F3 {I (k)} | I (k) | F3 {I (k)} |
|---|---|---|---|
| 15 | 7 | 31 | 7 |
| 14 | 7 | 30 | 7 |
| 13 | 3 | 29 | 3 |
| 12 | 3 | 28 | 3 |
| 11 | 1 | 27 | 1 |
| 10 | 1 | 26 | 1 |
| 9 | 1 | 25 | 1 |
| 8 | 1 | 24 | 1 |
| 7 | 1 | 23 | 1 |
| 6 | 1 | 22 | 1 |
| 5 | 0 | 21 | 0 |
| 4 | 0 | 20 | 0 |
| 3 | 0 | 19 | 0 |
| 2 | 0 | 18 | 0 |
| 1 | 0 | 17 | 0 |
| 0 | 0 | 16 | 0 |

Next, to find the frequency components of the difference signal d(k), the output e8(k) resulting from input of Q(k) to a second-order recursive bandpass filter having the characteristic shown in formula (21) is calculated, where Q(k) is proportional to d(k):

$$e8(k) = -0.123\{e8(k-1)/2 + Q(k-1)\} \tag{21}$$
$$-0.787\{e8(k-2)/2 + Q(k-2)\}$$

Next the mode control coefficient is successively updated by the m(k) calculated in formula (20), the e8(k) calculated in formula (21), and Q(k), according to the formulas given below:

$$t(k) = \begin{cases} (1 - 2^{-10})\{t(k-1) - 1\} + 1 - 2^{-8} & \text{when } m(k) < 2^{-2} \\ (1 - 2^{-10})\{t(k-1) - 1\} + 1 + 2^{-8} & tsgn\{Q(k)\}tsgn\{e8(k)\} \\ & \text{at otherwise} \end{cases} \tag{22}$$

where $$tsgn(\cdot) = \begin{cases} -1, & \text{if } (\cdot) < 0 \\ 0, & \text{if } (\cdot) = 0 \\ 1, & \text{if } (\cdot) > 0 \end{cases} \tag{23}$$

and t(k) is limited by 0 < t(k) < 1.

$$t1(k) = \begin{cases} (1 - 2^{-7})t1(k-1) + 2^{-7} & \text{when } t(k) \geq 0.8 \\ (1 - 2^{-7})t1(k-1) & \text{at otherwise} \end{cases} \tag{24}$$

$$l(k) = \begin{cases} (1 - 2^{-7})l(k-1) + 2^{-7} & \text{when } t1(k) \geq 0.8 \\ (1 - 2^{-7})l(k-1) & \text{at otherwise} \end{cases} \tag{25}$$

The signal reconstructed by the inverse adaptive quantizer 59 is the reconstructed difference signal D(k) containing the quantizing error. This signal D(k) is sent to the tap coefficients adaptation for adaptive-zero predictor 64, the adaptive-zero predictor 65, the adder 66, the tap coefficients adaptation for adaptive-pole predictor 67, and the offset predictor 68.

The tap coefficients adaptation for adaptive-zero predictor 64 uses the reconstructed difference signals D(k) and D(k-i) (i=1 to 10) to update the tap coefficients bi (i=1 to 10) as shown in formulas (26) and (27), and sends them to the adaptive-zero predictor 65.

$$bi(k) = (1-2^{-7})bi(k-1) + 2^{-6}\text{tsgn}\{D(k)\}\text{tsgn}\{D(k-1)\} \quad (26)$$

where the tap coefficients output according to the bit-rate switching signal QS input at the external input terminal 69 are given by formula (27):

$$bi = \begin{cases} f(bi) & \text{when } QS = 1 \text{ or } 3 \\ bi & \text{when } QS = 2 \end{cases} \quad (27)$$

where $f(\bullet)$ indicates the execution of a prespecified process for truncating the fraction part.

The adaptive-zero predictor 65 calculates the adaptive-zero predictor estimate e1(k) from the tap coefficients bi received from the tap coefficients adaptation for adaptive-zero predictor 64 and the reconstructed difference signal D(k-i) (i=1 to 10) according to formula (28).

$$e1(k) = \sum_{i=1}^{10} bi(k-1)D(k-i) \quad (28)$$

The adaptive-zero predictor estimate e1(k) is sent to the adders 66 and 82. The adder adds the adaptive zero predictor estimate e1(k) received from the adaptive-zero predictor 65 and the reconstructed difference signal D(k), generates a first partial reconstructed value D1(k), and sends it to the adaptive gain controller (I) 70 and the adder 76.

The tap coefficients adaptation for adaptive-pole predictor 67 update the adaptive pole predictor tap coefficients ai (i=1 to 4) according to the formula given below, using the reconstructed difference signals D(k) and D(k-i) (i=1 to 4) received from the inverse adaptive quantizer 59. The wi(k) in formula (29) are disposed at separated positions on the unit circle in the Z-plane, so the updated values satisfy a separation rule. (U.S. Pat. No. 4,779,225)

$$w_i(k) = \begin{cases} (1 - 2^{-7})\{w_i(k-1) - W_i\} + W_i - \\ 2 - 8\text{tsgn}\{D(k)\}\text{tsgn}\{p_i(k-1)\} \\ \text{when } w_i(k-1) - w_{i-1}(k-1) > W_{i+4} \\ \text{and } w_{i+1}(k-1) - w_i(k-1) > W_{i+5} \\ (1 - 2^{-7})\{w_i(k-1) - W_i\} + W_i \text{ at other times} \end{cases} \quad (29)$$

where $w_0(k) = 0$, $w_5(k) = \pi$, $W_1 = 0.3501$, $W_2 = 0.5520$, $W_3 = 1.5010$, $W_4 = 2.2160$, $W_5 = 0.1570$, $W_6 = W_7 = W_8 = 0.0313$, and $W_9 = 0.3928$.

$$\begin{aligned} p_1(k) &= D(k) + \{1 - r_3(3)\}\{D(k-1) + D(k-2)\} + D(k-3) \\ p_2(k) &= D(k) - \{1 + r_4(k)\}\{D(k-1) - D(k-2)\} - D(k-3) \\ p_3(k) &= D(k) + \{1 - r_1(k)\}\{D(k-1) + D(k-2)\} + D(k-3) \\ p_4(k) &= D(k) - \{1 + r_2(k)\}\{D(k-1) - D(k-2)\} - D(k-3) \end{aligned} \quad (30)$$

The tap coefficients derived from the wi(k) satisfying the separation rule are:

$$\begin{aligned} a_1(k) &= -r_1(k) - r_2(k) - r_3(k) - r_4(k) \\ a_2(k) &= 4 - r_1(k) + r_2(k) - r_3(k) + r_4(k) + r_1(k)r_3(k) + r_2(k)r_4(k) \\ a_3(k) &= -r_1(k) - r_2(k) - r_3(k) - r_4(k) + r_1(k)r_3(k) - r_2(k)r_4(k) \\ a_4(k) &= 2 - r_1(k) + r_2(k) - r_3(k) + r_4(k) \end{aligned} \quad (31)$$

where $r_i(k)$ is the coefficient given by formula (32):

$$r_i(k) = 2\cos\{w_i(k)\} \quad (32)$$

The adaptive-pole predictor tap coefficients $a_i$ (i=1 to 4) obtained from formula (31) are sent to the adaptive gain controller (I) 70 and the adaptive-pole predictor 71.

The adaptive gain controller (I) 70 receives the first partial reconstructed value D1(k) generated by the adder 66 and the $a_i$ (i=1 to 4) calculated by the tap coefficients adaptation for adaptive-pole predictor 67 and calculates an adaptive coefficient g1(k) from the following formula:

$$g1(k) = (1 - 2^{-10})g1(k-1) + \alpha \cdot \text{tsgn}\{D1(k)\}\text{tsgn}\{e5(k)\} \quad (33)$$

where e5(k) is:

$$e5(k) = -\sum_{i=1}^{4} a_i(k-1)\{D1(k-i) + e5(k-i)/2\} \quad (34)$$

and $\alpha$ is $2^{-8}$ when the bit-rate switching signal QS input at the external input terminal 80 is QS=1 or QS=3, and $\alpha = 2^{-7}$ when QS=2. The g1(k) updated according to formula (33) is limited so that $-0.125 \leq g1(k) \leq 1.25$, then finally g2(k) is determined from formula (35) and sent to the coefficient circuit 74.

$$g2(k) = \begin{cases} 0 & \text{when } g1(k-1) \leq 0 \\ 1 & \text{when } g1(k-1) \geq 1 \\ g1(k-1) & \text{at otherwise} \end{cases} \quad (35)$$

The adder 76 adds the estimate e2(k) calculated by the adaptive-pole predictor 71 and the first partial reconstructed value D1(k) generated by the adder 66, generates a second partial reconstructed value D2(k), and sends it to the adaptive-pole predictor 71, the adaptive gain controller (II) 72, and the adder 77. The estimated output of the adaptive-pole predictor 71 is calculated according to formula (36):

$$e2(k) = g2(k) \left\{ -1/2 \sum_{i=2}^{4} a_i(k-1)D2(k-i) \right\} \quad (36)$$

The adaptive gain controller (II) 72 performs the following calculation using the second partial reconstructed value D2(k) generated by the adder 76 and the value 1/u(k) received from the scale factor adaptation section 56:

$$g4(k) = \begin{cases} (1 - 2^{-10})\{g4(k-1) - 1\} + 1 - \\ 2^{-8} \text{ when } 1/u(k) \geq 750 \\ (1 - 2^{-10})\{g4(k-1) - 1\} + 1 + \\ 2^{-8}tsgn\{D2(k)\}tsgn\{e6(k)\} \end{cases}$$

at otherwise (37)
where e6(k) is:

$$e6(k) = 0.5017 D2(k-1) - 0.36755 D2(k-2) - 0.5343 D2(k-3) \quad (38)$$

When the value of the bit-rate switching signal QS input at the external input terminal 81 is QS=2, formula (37) is altered to formula (39):

$$g4(k) = (1 - 2^{-10})\{g4(k-1) - 1\} + 1 - 2^{-7} \quad (39)$$

The value of g4(k) as updated by formula (37) or (39) is limited by $-0.125 \leq g4(k) \leq 1.25$, then finally g3(k) is determined from formula (40) and sent to the coefficient circuit 75.

$$g3(k) = \begin{cases} 0 & \text{when } g4(k-1) \leq 0 \\ 1.1 & \text{when } g4(k-1) \geq 1.1 \\ g4(k-1) & \text{at otherwise} \end{cases} \quad (40)$$

The adder 77 adds the estimate e3(k) from the fixed-pole predictor 73 and the second partial reconstructed value D2(k) generated by the adder 76, generates a third partial reconstructed value D3(k), and sends it to the fixed-pole predictor 73.

The fixed-pole predictor 73 calculates the estimate e3(k) according to formula (41):

$$e3(k) = g3(k) \sum_{i=1}^{16} c_i D3(k-i) \quad (41)$$

where $c_i$ (i=1 to 16) is the value given in Table 13.

TABLE 13

| i | 1 | 2 | 3 | 4 | 5 | 6 | 7 |
|---|---|---|---|---|---|---|---|
| $c_i$ | 1.0034 | −1.7419 | 1.4170 | −1.8785 | 1.0615 | −1.2004 | 0.2230 |
| i | 8 | 9 | 10 | 11 | 12 | 13 | 14 |
| $c_i$ | −0.3077 | −0.4208 | 0.1938 | −0.5917 | 0.2434 | −0.3826 | 0.0840 |
| i | 15 | 16 | — | — | — | — | — |
| $c_i$ | −0.1217 | −0.0214 | — | — | — | — | — |

The offset predictor 68, which rejects the offset component of the input signal, receives the reconstructed difference signal D(k) output from the inverse adaptive quantizer 59 and the value 1/u(k) output from the quantizer scale factor adaptation 56 and calculates an estimate e4(k) according to formula (42):

$$e4(k) = \begin{cases} (1 - 2^{-7})e4(k-1) + 2^{-14}tsgn\{D(k-1)\} \\ \quad \text{when } 1/u(k-1) \geq 256 \\ (1 - 2^{-7})e4(k-1) + 2^{-11}tsgn\{D(k-1)\} \end{cases} \quad (42)$$

To obtain the estimate e(k) of the adaptive predictor 54, first the adder 79 adds the estimate e4(k) from the offset predictor 68 to the estimate e3(k) from the fixed-pole predictor 73, then the adder 78 adds the output of the adder 79 to the estimate e2(k) of the adaptive-pole predictor 71, then finally the adder 82 adds the output from the adder 78 to the estimate e1(k) to the adaptive-zero predictor 65.

Next the operation of the decoder 100 will be explained. The ADPCM code I(k) received at the code input terminal 101 is supplied to the inverse adaptive quantizer 102, which generates a reconstructed difference signal D(k) using a scale factor u(k) from the quantizer scale factor adaptation 104. This reconstructed signal D(k) is sent to the adder 122, which adds it to an estimated value e1(k) from the adaptive-zero predictor 121 to obtain a first partial reconstructed value D1(k). Next the first reconstructed value D1(k) is sent to the adder 132, which adds it to an estimated value e2(k) from the adaptive-pole predictor 127 to obtain a second partial reconstructed value D2(k). The second partial reconstructed value D2(k) is sent to the adder 133, which adds it to an estimated value e3(k) from the fixed-pole predictor 129 to obtain a third partial reconstructed value D3(k). The adder 139 adds the third partial reconstructed value D3(k) and an estimated value e4(k) from the offset predictor 124 to form the reconstructed signal s1(k) of the input signal s(k).

The line status diagnostic section 105 detects the following values of the ADPCM code I(k) input at the code input terminal 101, depending on the bit-rate switching signal input at the external input terminal 114:

| | |
|---|---|
| "1 1 1 1" | when QS = 1 |
| "1 1 1" | when QS = 2 |
| "1 1 1 1" | when QS = 3 |

When such a value is detected continuously for at least a preset time, a TRG (trigger) signal is set to "1" and sent to the reset circuit 106.

When the TRG signal is "1," the reset circuit 106 forcibly sets the state of the internal memories of the adaptation mode controller 103, the quantizer scale factor adaptation 104, the tap coefficients adaptation for adaptive-zero predictor 120, the adaptive-zero predictor 121, the adaptive gain controller (I) 126, the tap coefficients adaptation for adaptive-pole predictor 123, the adaptive-pole predictor 127, the adaptive gain controller (II) 128, the fixed-pole predictor 129, and the offset predictor 124 to a specified state, and sets all eight bits of the output Y(k) of the synchronous coding adjustment 109 to "1" in the $\mu$-law case, or to "0" in the A-law case.

As long as no bit error occurs between the code output terminal 110 and the code input terminal 101 or the reset circuit 106 present only in the decoder 100 does not operate, the adaptation mode controller 103, the quantizer scale factor adaptation 104, and the elements (120, 121, 126, 123, 127, 128, 129, and 124) of the adaptive predictor 107 in the decoder 100 operate identically to the corresponding elements 61, 56, 54 (64, 65, 70, 67, 71, 72, 73, and 68) of the encoder 50, and their internal states also agree.

The reconstructed signal s1(k) of the input signal s(k) is input to the output PCM format conversion 108, converted to a $\mu$-law or A-law PCM code X(k), and sent to the synchronous coding adjustment 109. The synchronous coding adjustment 109 adjusts the quantizing error that occurred in the PCM-ADPCM conversion and sends an eight-bit PCM code Y(k) to the output terminal 110.

In this embodiment, first, the adaptive predictor is structured as follows in order to obtain a signal estimate that closely matches time-dependent variations in the input signal: the input signal is considered to consist of a fluctuating-frequency component and fixed component with a substantially unvarying frequency composition; adaptive-pole and adaptive-zero predictors of arbitrary order are provided for the fluctuating component; a fixed-pole predictors of arbitrary order is provided for the fixed component; an offset predictors is provided to reject the offset component; these elements are connected in series; and a circuit is provided to control the estimates output from the adaptive- and fixed-pole predictor. Next, for the adaptive quantizer and inverse adaptive quantizer, the cases in which the input signal power shows large fluctuations over time and small fluctuations over time are treated separately, and a circuit is provided that can be set to a short-term mode for large fluctuations and a long-term mode for small fluctuations. In addition, external input terminals are provided for an input signal that can select 32, 24, or 40-kbits/s as the bit rate.

Figure 2:
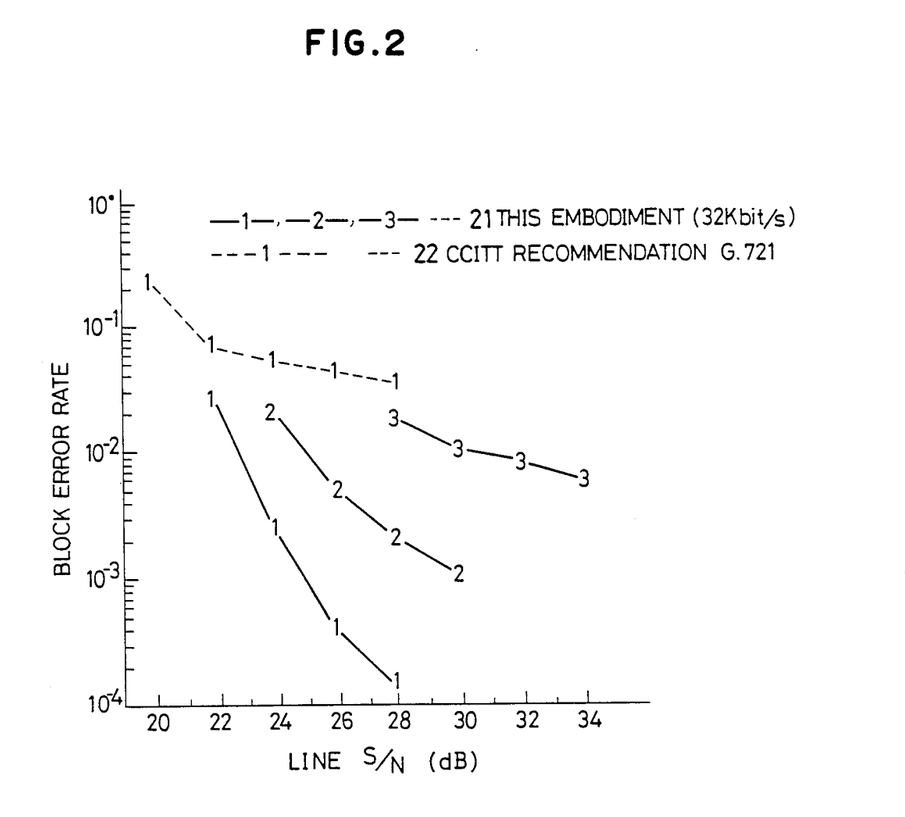
FIG. 2 and FIG. 3 illustrate line S/N vs. block error rate characteristics at rates of 32-kbit/s and 40-kbit/s for this invention for V.29 9600 bit/s modem signal, respectively.

The first effect of the preceding embodiment having this structure will be described with reference to FIG. 2. FIG. 2 is a graph illustrating the performance of this embodiment for a 32-kbit/s ADPCM signal with a CCITT standard V.29 modem operating at 9600 bit/s: specifically, it shows the line S/N vs. block error rate characteristic. In this graph numeral 21 denotes the embodiment described above; numeral 22 denotes the characteristic given in CCITT recommendation G.721. The characteristics in FIG. 2 were obtained under the measurement conditions of Report R-28 of CCITT SG-18. The subscripts 1, 2, and 3 in the graph indicate the number of asynchronous interconnections. As is clear from FIG. 2, the embodiment of the present invention gives modem signal transmission characteristics that are superior to CCITT recommendation G.721.

A second effect of the embodiment of this invention is that it permits the selection of 24 kbit/s, and avoided hence the freezeout of input tranks commonly used in DSI systems.

Figure 3:
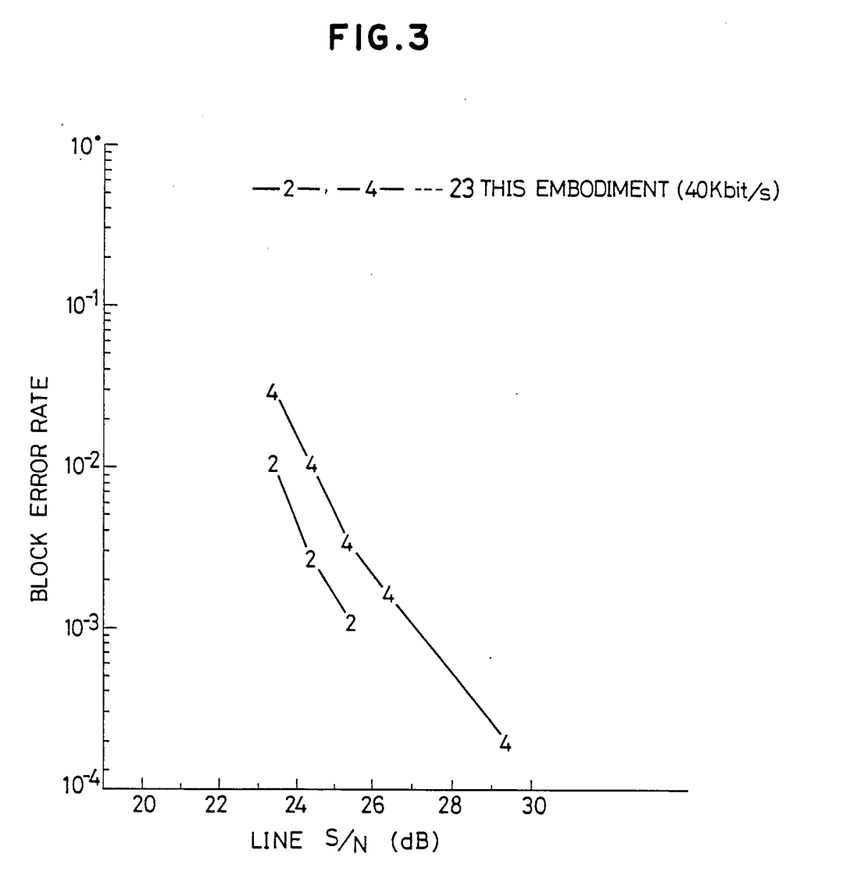

A third effect will be described with reference to FIG. 3. FIG. 3 is a graph illustrating the performance of this embodiment for a 40-kbit/s ADPCM signal with a CCITT standard V.29 modem operating at 9600 bit/s: specifically, it shows the line S/N vs. block error rate characteristic. The subscripts 2 and 4 in the graph indicate the number of asynchronous interconnections. The measurement conditions are the same as for FIG. 2. As is clear from FIG. 3, it is possible to transmit V.29 9600 bit/s modem signals over three or more asynchronous tandem links.

As explained in detail above, this invention has the advantages of being able to transmit high-speed modem signals, avoiding the freezeout of input tranks commonly used in DSI systems, and being able to transmit 9600 bit/s and higher-speed modem signals over three or more asynchronously interconnected links.

What is claimed is:

1. An ADPCM encoding and decoding system comprising:
   (a) an encoder having an adaptive predictor, an adaptive quantizer and an inverse adaptive quantizer, wherein said adaptive predictor comprises:
   an adaptive-zero predictor of an arbitrary order and an adaptive-pole predictor of an arbitrary order for receiving input signals with time-varying frequency components;
   a fixed-pole predictor of an arbitrary order for receiving input signals the frequency composition of which remains substantially invariant over time; and
   an offset predictor for rejecting an offset component of the input signals, said adaptive-zero predictor, said adaptive-pole predictor, said fixed-pole predictor and said offset predictor being coupled to the output of said inverse adaptive quantizer; and
   (b) a decoder having an adaptive predictor and an inverse adaptive quantizer, wherein said adaptive predictor comprises:
   an adaptive-zero predictor of an arbitrary order and an adaptive-pole predictor of an arbitrary order for receiving input signals with time-varying frequency components;
   a fixed-pole predictor of an arbitrary order for receiving input signals the frequency composition of which remains substantially invariant over time; and
   an offset predictor for rejecting an offset component of the input signals, said adaptive-zero predictor, said adaptive-pole predictor, said fixed-pole predictor and said offset predictor being coupled to the output of said inverse adaptive quantizer.

2. An ADPCM encoding and decoding system according to claim 1, wherein said encoder further comprises a control circuit which varies succesively the outputs of the adaptive-pole predictor and the fixed-pole predictor thereof; and said decoder further comprises a control circuit which varies successively the outputs of the adaptive-pole predictor and the fixed-pole predictor thereof.

3. An ADPCM encoding and decoding system according to claim 1, wherein the characteristic of the adaptive-pole predictor in said encoder is expressed by a pair of Chebyshev polynomials having roots located at separated positions on the unit circle in the Z-plane, and the characteristic of the adaptive-pole predictor in said decoder is expressed by a pair of Chebyshev polynomials having roots located at separated positions on the unit circle in the Z-plane.

4. An ADPCM encoding and decoding system according to claim 1, wherein said encoder further comprises an adaptation mode controller receiving an input signal to said inverse adaptive quantizer and an output signal determined from said input signal by said inverse adaptive quantizer; and said decoder further comprises an adaptation mode controller receiving an input signal to said inverse quantizer and an output signal determined from said input signal by said inverse adaptive quantizer, wherein the adaptation mode controller of said encoder comprises:
  a first circuit for detecting fluctuations in the frequency components of said output signal of said inverse adaptive quantizer;
  a second circuit for detecting time-dependent fluctuations in the power of said output signal of said inverse adaptive quantizer; and
  a third circuit for selecting either a short-term mode or a long-term mode for said output signal of said inverse adaptive quantizer according to the detection result of said first circuit and/or said second circuit; and
said adaptation mode controller of said decoder comprises:
  a first circuit for detecting fluctuations in the frequency components of the output signal of said inverse adaptive quantizer;
  a second circuit for detecting time-dependent fluctuations in the power of the output signal of said inverse adaptive quantizer; and
  a third circuit for selecting either a short-term mode or a long-term mode for the output signal of said inverse adaptive quantizer according to the detection result of said first circuit and/or said second circuit.

5. An ADPCM encoding and decoding system according to claim 1 wherein in said encoder and decoder each of said adaptive predictors, said adaptive quantizers and said inverse adaptive quantizers is responsive to a bit selection signal supplied from outside of said ADPCM encoding and decoding system for selecting the bit rate of said adaptive predictors, said adaptive quantizer, and said inverse adaptive quantizers at which said adaptive predictors, said adaptive quantizers and said inverse adaptive quantizers operate.

6. An ADPCM encoding and decoding system according to claim 2, wherein in said encoder and decoder each of said adaptive predictors, said adaptive quantizers and said inverse adaptive quantizers is responsive to a bit selection signal supplied from outside of said ADPCM encoding and decoding system for selecting the bit rate of said adaptive predictors, said adaptive quantizers and said inverse adaptive quantizers at which said adaptive predictors, said adaptive quantizers and said inverse adaptive quantizers operate.

7. An ADPCM encoding and decoding system according to claim 3, wherein in said encoder and decoder each of said adaptive predictors, said adaptive quantizers and said inverse adaptive quantizers is responsive to a bit selection signal supplied from outside of said ADPCM encoding and decoding system for selecting the bit rate of said adaptive predictors, said adaptive quantizers and said inverse adaptive quantizers at which said adaptive predictors, said adaptive quantizers and said inverse adaptive quantizers operate.

8. An ADPCM encoding and decoding system according to claim 4, wherein in said encoder and decoder each of said adaptive predictors, said inverse adaptive quantizers, said inverse adaptive quantizers and said adaptation mode controllers is responsive to a bit selection signal supplied from outside of said ADPCM encoding and decoding system for selecting the bit rate of said adaptive predictors, said adaptive quantizers, said inverse adaptive quantizers and said adaptation mode controllers at which said adaptive predictors, said adaptive quantizers, said inverse adaptive quantizer and said adaptation mode controllers operate.

9. An ADPCM encoding circuit comprising an encoder having an adaptive predictor, an adaptive quantizer and an inverse adaptive quantizer, wherein said adaptive predictor comprises:
  an adaptive-zero predictor of an arbitrary order and an adaptive-pole predictor of an arbitrary order for receiving input signals with time-varying frequency components;
  a fixed-pole predictor of an arbitrary order for receiving input signals the frequency composition of which remains substantially invariant over time; and
  an offset predictor for rejecting an offset component of the input signals said adaptive-zero predictor, said adaptive-pole predictor, said fixed-pole predictor and said offset predictor being coupled to the output of said inverse adaptive quantizer.

10. An ADPCM encoding circuit according to claim 9, further comprising a control circuit which varies successively the outputs of said adaptive-pole predictor and said fixed-pole predictor.

11. An ADPCM encoding circuit according to claim 9, wherein the characteristic of the adaptive-pole predictor is expressed by a pair of Chebyshev polynomials having roots located at separated positions on the unit circle in the Z-plane.

12. An ADPCM encoding circuit according to claim 9, further comprising an adaptation mode controller receiving an input signal to said inverse adaptive quantizer and an output signal determined from said input signal by said inverse adaptive quantizer, wherein said adaptation mode controller of said encoder comprises:
  a first circuit for detecting fluctuations in the frequency components of said output signal of said inverse adaptive quantizer;
  a second circuit for detecting time-dependent fluctuations in the power of said output signal of said inverse adaptive quantizer; and
  a third circuit for selecting either a short-term mode or a long-term mode for said output signal of said inverse adaptive quantizer according to the detection result of said first circuit and/or said second circuit.

13. An ADPCM encoding circuit according to claim 9, wherein each of said adaptive predictor, said adaptive quantizer and said inverse adaptive quantizer is responsive to a bit selection signal supplied from outside of said ADPCM encoding circuit for selecting the bit rate of said adaptive predictor, said adaptive quantizer and said inverse adaptive quantizer at which said adaptive predictor, said adaptive quantizer and said inverse adaptive quantizer operate.

14. An ADPCM encoding circuit according to claim 10, wherein each of said adaptive predictor, said adaptive quantizer and said inverse adaptive quantizer is responsive to a bit selection signal supplied from outside of said ADPCM encoding circuit for selecting the bit rate of said adaptive predictor, said adaptive quantizer and said inverse adaptive quantizer at which said adaptive predictor, said adaptive quantizer and said inverse adaptive quantizer operate.

15. An ADPCM encoding circuit according to claim 11, wherein each of said adaptive predictor, said adaptive quantizer and said inverse adaptive quantizer is responsive to a bit selection signal supplied from outside of said ADPCM encoding circuit for selecting the bit rate of said adaptive predictor, said adaptive quantizer and said inverse adaptive quantizer at which said adaptive predictor, said adaptive quantizer and said inverse adaptive quantizer operate.

16. An ADPCM encoding circuit according to claim 12, wherein each of said adaptive predictor, said inverse adaptive quantizer, said inverse adaptive quantizer and said adaptation mode controller is responsive to a bit selection signal supplied from outside of said ADPCM encoding circuit for selecting the bit rate of said adaptive predictor, said adaptive quantizer, said inverse adaptive quantizer and said adaptation mode controller at which said adaptive predictor, said adaptive quantizer, said inverse adaptive quantizer and said adaptation mode controller operate.

17. An ADPCM decoding circuit comprising a decoder having an adaptive predictor and an inverse adaptive quantizer, wherein said adaptive predictor comprises:
    an adaptive-zero predictor of an arbitrary order and an adaptive-pole predictor of an arbitrary order for receiving input signals with time-varying frequency components;
    a fixed-pole predictor of an arbitrary order for receiving input signals the frequency components of which remains substantially invariant over time; and
    an offset predictor for rejecting an offset component of the input signals, said adaptive-zero predictor, said adaptive-pole predictor being coupled to the output of said inverse adaptive quantizer.

18. An ADPCM decoding circuit according to claim 17, further comprising a control circuit which varies successively the outputs of said adaptive-pole predictor and said fixed-pole predictor.

19. An ADPCM decoding circuit according to claim 17, wherein the characteristic of the adaptive-pole predictor is expressed by a pair of a Chebyshev polynomials having roots located at separated positions on the unit circle in the Z-plane.

20. An ADPCM decoding circuit according to claim 17, further comprising an adaptation mode controller receiving an input signal to said inverse adaptive quantizer and an output signal determined from said input signal by said inverse adaptive quantizer, wherein said adaptation mode controller of said decoder comprises:
    a first circuit for detecting fluctuations in the frequency components of said output signal of said inverse adaptive quantizer;
    a second circuit for detecting time-dependent fluctuations in the power of said output signal of said inverse adaptive quantizer; and
    a third circuit for selecting either a short-term mode or a long-term mode for said output signal of said inverse adaptive quantizer according to the detection result of said first circuit and/or said second circuit.

21. An ADPCM decoding circuit according to claim 17, wherein each of said adaptive predictor, said adaptive quantizer and said inverse adaptive quantizer is responsive to a bit selection signal supplied from outside of said ADPCM decoding circuit for selecting the bit rate of said adaptive predictor, said adaptive quantizer and said inverse adaptive quantizer at which said adaptive predictor, said adaptive quantizer and said inverse adaptive quantizer operate.

22. An ADPCM decoding circuit according to claim 18, wherein each of said adaptive predictor, said adaptive quantizer and said inverse adaptive quantizer is responsive to a bit selection signal supplied from outside of said ADPCM decoding circuit for selecting the bit rate of said adaptive predictor, said adpative quantizer and said inverse adaptive quantizer at which said adaptive predictor, said adaptive quantizer and said inverse adaptive quantizer operate.

23. An ADPCM decoding circuit according to claim 19, wherein each of said adaptive predictor, said adaptive quantizer and said inverse adaptive quantizer is responsive to a bit selection signal supplied from outside of said ADPCM decoding circuit for selecting the bit rate of said adaptive predictor, said adaptive quantizer and said inverse adaptive quantizer at which said adaptive predictor, said adaptive quantizer and said inverse adaptive quantizer operate.

24. An ADPCM decoding circuit according to claim 20, wherein each of said adaptive predictor, said inverse adaptive quantizer, said inverse adaptive quantizer and said adaptation mode controller is responsive to a bit selection signal supplied from outside of said ADPCM decoding circuit for selecting the bit rate of said adaptive predictor, said adaptive quantizer, said inverse adaptive quantizer and said adaptation mode controller at which said adaptive predictor, said adaptive quantizer, said inverse adaptive quantizer and said adaptation mode controller operate.

* * * * *